(12) United States Patent
Zhong et al.

(10) Patent No.: US 8,946,997 B2
(45) Date of Patent: Feb. 3, 2015

(54) END-OF-LIFE DETECTOR FOR GAS DISCHARGE LAMP AND THE BALLAST INCORPORATING THE SAME

(75) Inventors: Yuanyuan Zhong, Shanghai (CN); Weiqiang Zhang, Shanghai (CN); Jianping Ying, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 375 days.

(21) Appl. No.: 13/339,675

(22) Filed: Dec. 29, 2011

(65) Prior Publication Data

US 2013/0033182 A1 Feb. 7, 2013

(30) Foreign Application Priority Data

Aug. 4, 2011 (CN) .......................... 2011 1 0222105

(51) Int. Cl.
*H05B 37/04* (2006.01)
*G01R 31/24* (2006.01)
*H05B 41/285* (2006.01)

(52) U.S. Cl.
CPC ............ *G01R 31/24* (2013.01); *H05B 41/2855* (2013.01)
USPC ......................................... 315/131; 315/127

(58) Field of Classification Search
CPC ........... H05B 41/2828; H05B 41/2985; H05B 41/2855; H05B 41/295; H05B 41/3925; H05B 41/3927; H05B 41/28; H05B 41/2827; H05B 41/2856; H05B 39/044; H05B 39/08; H05B 41/042; H05B 41/2883; H05B 41/2925

USPC ................................... 315/127, 129, 130–136
See application file for complete search history.

(56) References Cited

U.S. PATENT DOCUMENTS

| 5,677,602 | A | 10/1997 | Paul et al. |
| 7,154,232 | B2 * | 12/2006 | Contenti et al. ............... 315/225 |
| 7,312,588 | B1 | 12/2007 | Yu et al. |
| 8,410,718 | B2 * | 4/2013 | Anissimov .................... 315/291 |
| 2004/0104691 | A1 * | 6/2004 | Lott .............................. 315/224 |
| 2009/0079367 | A1 * | 3/2009 | Crouse et al. ................. 315/307 |
| 2010/0327763 | A1 | 12/2010 | Yao et al. |

* cited by examiner

*Primary Examiner* — Douglas W Owens
*Assistant Examiner* — Monica C King
(74) *Attorney, Agent, or Firm* — Kirton McConkie; Evan R. Witt

(57) ABSTRACT

Disclosed is an end-of-life detector for gas discharge lamp and the ballast incorporating the same. The end-of-life detector includes a lamp state signal detecting circuit for detecting the lamp state signal of at least one first gas discharge lamp and generating a positive voltage signal and a negative voltage signal accordingly; a comparing circuit for comparing the positive voltage signal with a positive selecting voltage and comparing the negative voltage signal with a negative selecting voltage, and in response thereto generating a positive control signal and a negative control signal; and a positive/negative duty time interval detecting circuit for generating a lamp life state signal which is generated by a difference between a positive duty time interval and a negative duty time interval. The lamp life state signal is varied along with the difference between the positive duty time interval and the negative duty time interval.

26 Claims, 9 Drawing Sheets

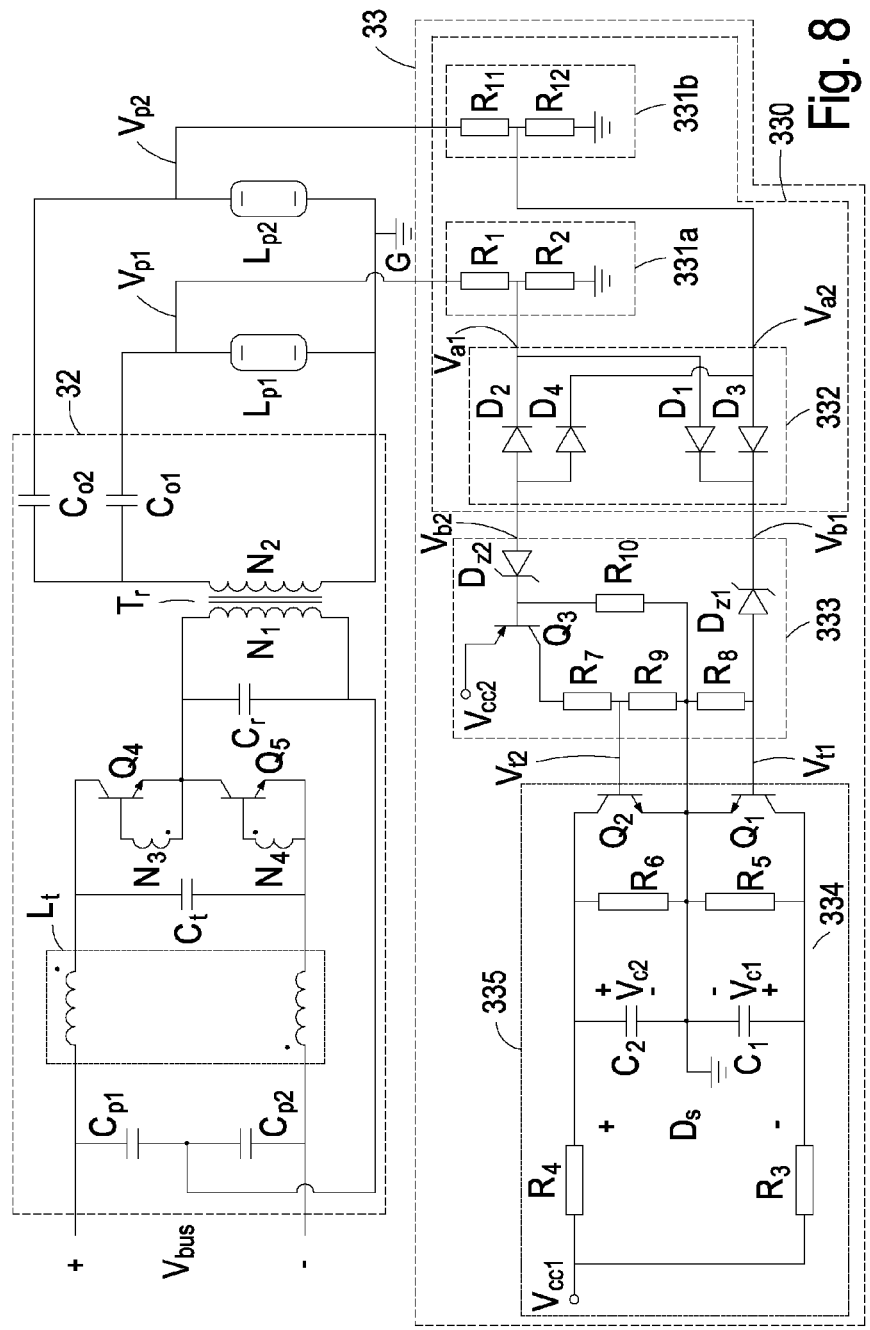

END-OF-LIFE DETECTOR FOR GAS DISCHARGE LAMP AND THE BALLAST INCORPORATING THE SAME

FIELD OF THE INVENTION

The invention is related to a detector, and more particularly to an end-of-life detector for gas discharge lamp and the ballast incorporating the same.

BACKGROUND OF THE INVENTION

Gas discharge lamp is used to illuminate based on the theorem of gas discharge. The filaments of the gas discharge lamp are generally coated with emissive material. After the gas discharge lamp has been used for a long time, the emissive material coated on the filaments will be depleted. The loss of the emissive material will complicate the emission of the electrons by the filaments. When a considerable loss of the emissive material is happened, the lamp will enter the end-of-life (EOL) state.

Referring to FIG. 1 and FIG. 2, in which FIG. 1 shows the equivalent circuit of the gas discharge lamp and FIG. 2 shows the waveform of the lamp voltage of the gas discharge lamp. As shown in FIG. 1, the positive equivalent resistor Rp1 of the gas discharge lamp 1 and the negative equivalent resistor Rp2 of the gas discharge lamp 1 will have the same resistance, and their resistance will be varied along with the state of the gas discharge lamp 1. When the gas discharge lamp 1 is ignited, the resistance of the positive equivalent resistor Rp1 and the negative equivalent resistor Rp2 will change from a high resistance value to a low resistance value. Under this condition, the waveform of lamp voltage across the gas discharge lamp 1 in the positive half-cycle and the waveform of the lamp voltage across the gas discharge lamp 1 in the negative half-cycle are symmetrical, as indicated by the symbol Vpa of FIG. 2. When the gas discharge lamp 1 has been used for a long time and starts aging, i.e. when the lifetime of the gas discharge lamp 1 is going to an end, the discharging characteristics of the gas discharge lamp 1 in the positive half-cycle will be different from the discharging characteristics of the gas discharge lamp 1 in the negative half-cycle. That is, the resistance of the positive equivalent resistor Rp1 will be different from the resistance of the negative equivalent resistor Rp2. This would make the operation of the gas discharge lamp 1 abnormal. Under this condition, the waveform of lamp voltage across the gas discharge lamp 1 in the positive half-cycle and the waveform of the lamp voltage across the gas discharge lamp 1 in the negative half-cycle are asymmetrical, as indicated by the symbol Vpb of FIG. 2. Thus, the temperature of the cathode of the gas discharge lamp 1 will increase, which will damage the fixture socket of the gas discharge lamp 1, or break the glass of the gas discharge lamp 1.

Hence, it is intended to develop an end-of-life detector for gas discharge lamp and the ballast incorporating the same to precisely detect and determine if the gas discharge lamp has entered the end-of-life state, thereby providing necessary protection function.

SUMMARY OF THE INVENTION

An object of the invention is to provide an end-of-life detector for gas discharge lamp and the ballast incorporating the same. The inventive end-of-life detector for gas discharge lamp can precisely detect that the gas discharge lamp has entered the end-of-life state when the lifetime of the gas discharge lamp is going to an end, and can stop outputting power to the gas discharge lamp. Therefore, the temperature of the electrodes of the gas discharge lamp can be prevented from going too high so as to damage the fixture socket of the gas discharge lamp.

To this end, a broad aspect of the invention is accomplished by the provision of an end-of-life detector for gas discharge lamp for detecting the lamp state of at least one first gas discharge lamp. The inventive end-of-life detector for gas discharge lamp includes a lamp state signal detecting circuit connected to the at least one first gas discharge lamp for detecting a lamp state signal of the at least one first gas discharge lamp and in response thereto generating a positive voltage signal during positive half-cycles of the lamp state signal and a negative voltage signal during negative half-cycles of the lamp state signal; a comparing circuit connected to the lamp state signal detecting circuit for comparing the positive voltage signal with a positive selecting voltage and comparing the negative voltage signal with a negative selecting voltage, and in response thereto generating a positive control signal and a negative control signal; and a positive/negative duty time interval detecting circuit connected to the comparing circuit for generating a lamp life state signal which is generated by a difference between a positive duty time interval defined by the positive control signal and a negative duty time interval defined by the negative control signal. It is to be noted that the lamp life state signal is varied along with the difference between the positive duty time interval and the negative duty time interval.

Another broad aspect of the invention is accomplished by the provision of a ballast for driving at least one first gas discharge lamp. The inventive ballast includes a power circuit for converting an input voltage into at least one first lamp voltage for driving the at least one first gas discharge lamp; a control unit for controlling operations of the ballast; and an end-of-life detector for gas discharge lamp connected to the first gas discharge lamp and the control unit. The inventive end-of-life detector includes a lamp state signal detecting circuit connected to the first gas discharge lamp for detecting a lamp state signal of the at least one first gas discharge lamp and in response thereto generating a positive voltage signal during the positive half-cycle of the lamp state signal and a negative voltage signal during the negative half-cycle of the lamp state signal; a comparing circuit connected to the lamp state signal detecting circuit for comparing the positive voltage signal with a positive selecting voltage and comparing the negative voltage signal with a negative selecting voltage, and in response thereto generating a positive control signal and a negative control signal; and a positive/negative duty time interval detecting circuit connected to the comparing circuit for generating a lamp life state signal which is generated by a difference between a positive duty time interval defined by the positive control signal and a negative duty time interval defined by the negative control signal. The control unit is configured to control operations of the power circuit according to the lamp life state signal. When the control unit determines that the first gas discharge lamp has entered an end-of-life state by the lamp life state signal, the control unit activates protection functions for the power circuit.

Hence, the inventive end-of-life detector for gas discharge lamp can detect if the gas discharge lamp has entered the end-of-life state. When the gas discharge lamp has entered the end-of-life state, the control unit of the ballast will activate the protection function to stop driving the gas discharge lamp which has entered the end-of-life state. Thus, the electrodes of the gas discharge lamp can be prevented from overheating, and the fixture socket securing the gas discharge lamp can be protected from damage.

Now the foregoing and other features and advantages of the invention will be best understood through the following descriptions with reference to the accompanying drawings, in which:

BRIEF DESCRIPTION OF THE DRAWINGS

FIG. 8 shows the partial circuitry of the ballast according to the first embodiment of the invention;

DESCRIPTION OF THE PREFERRED EMBODIMENT

An exemplary embodiment embodying the features and advantages of the invention will be expounded in following paragraphs of descriptions. It is to be realized that the present invention is allowed to have various modification in different aspects, all of which are without departing from the scope of the present invention, and the description herein and the drawings are to be taken as illustrative in nature, but not to be taken as a confinement for the invention.

Figure 1:
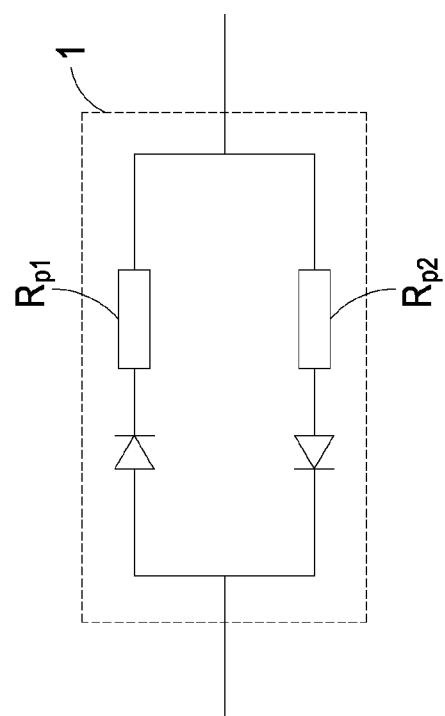
FIG. 1 shows the equivalent circuit of the gas discharge lamp.
Figure 2:
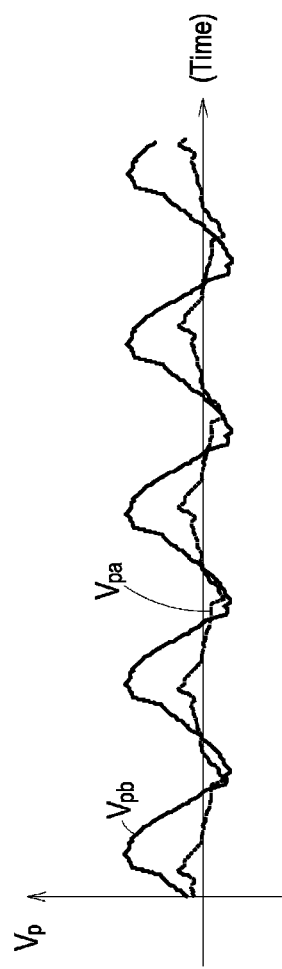
FIG. 2 shows the waveform of the lamp voltage of the gas discharge lamp.
Figure 3:
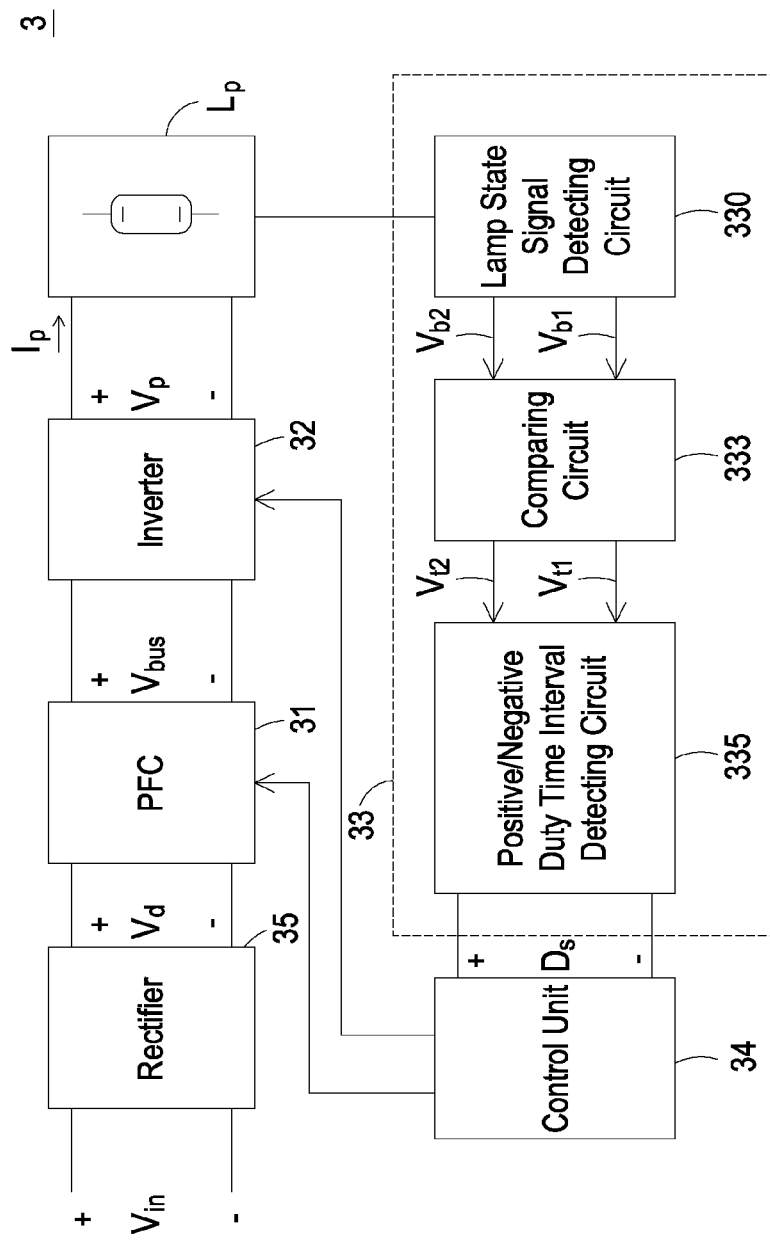
FIG. 3 shows the circuit block diagram of the ballast according to a first embodiment of the invention.

Referring to FIG. 3, which shows the circuit block diagram of the ballast according to a first embodiment of the invention. As shown in FIG. 3, the ballast includes a power factor correction circuit (PFC circuit) 31, an inverter 32, an end-of-life detector 33 for gas discharge lamp, a control unit 34, and a rectifier 35. The power output end of the rectifier 35 is connected to the power input end of the power factor correction circuit 31. The power output end of the power factor correction circuit 31 is connected to the power input end of the inverter 32. The power output end of the inverter 32 is connected to at least one gas discharge lamp Lp. In this embodiment, the gas discharge lamp Lp is a fluorescent lamp.

In operation, the rectifier 35 is used to rectify the low-frequency (e.g. 60 Hz) AC input voltage Vin into a full-wave rectified DC voltage Vd. Afterwards, the full-wave rectified DC voltage Vd is converted into a DC bus voltage Vbus by the power factor correction circuit 31. The voltage level of the DC bus voltage Vbus could be, for example, 400 VDC. Also, the power factor of the low-frequency AC input voltage Vin is corrected by the power factor correction circuit 31. Next, the inverter 32 is used to convert the bus voltage Vbus into at least one high-frequency (e.g. 20 kHz) AC lamp voltage Vp for driving the gas discharge lamp Lp. In conclusion, the power circuit consisted of the power factor correction circuit 31, the inverter 32, and the rectifier 35 is configured to convert the low-frequency AC input voltage Vin into at least one high-frequency AC lamp voltage Vp for driving the at least one gas discharge lamp Lp.

In this embodiment, the end-of-life detector 33 for gas discharge lamp is connected to the at least one gas discharge lamp Lp and the control unit 34 for detecting if the at least one gas discharge lamp Lp enters the end-of-life state. Accordingly, the end-of-life detector 33 for gas discharge lamp can generate a lamp life state signal Ds according to the state of the gas discharge lamp Lp. The lamp life state signal Ds can be varied along with the state of the gas discharge lamp Lp. The end-of-life detector 33 for gas discharge lamp can be implemented by an analog circuit or a digital circuit. The control unit 34 may be implemented by a digital controller or an analog controller, or a digital and analog controller. The control unit 34 is connected to the power factor correction circuit 31, or/and the inverter 32, and the end-of-life detector 33 for gas discharge lamp for controlling the operations of the power factor correction circuit 31 or/and the inverter 32 according to the lamp life state signal Ds. When the control unit 34 determines that the at least one gas discharge lamp Lp has entered the end-of-life state by the lamp life state signal Ds, the control unit 34 will drive the power factor correction circuit 31 or/and the inverter 32 to activate the protection functions accordingly. The protection functions could be activated to stop driving the gas discharge lamp Lp that has entered the end-of-life state.

In this embodiment, the end-of-life detector 33 for gas discharge lamp includes a lamp state signal detecting circuit 330, a comparing circuit 333, and a positive/negative duty time interval detecting circuit 335. The lamp state signal detecting circuit 330 is connected to the at least one gas discharge lamp Lp and the comparing circuit 333 for detecting a lamp state signal of the at least one gas discharge lamp Lp. The lamp state signal could be a lamp voltage Vp or a lamp current Ip. The lamp state signal is converted by a voltage converter or a current converter into a positive voltage signal Vb1 in the positive half-cycle and a negative voltage signal Vb2 in the negative half-cycle. The comparing circuit 333 is connected between the lamp state signal detecting circuit 330 and the positive/negative duty time interval detecting circuit 335 for comparing the positive voltage signal Vb1 with a positive selecting voltage Vk1 and comparing the negative voltage signal Vb2 with a negative selecting voltage Vk2 and in response thereto generating a positive control signal Vt1 and a negative control signal Vt2. The positive control signal Vt1 and the negative control signal Vt2 are sent to positive/negative duty time interval detecting circuit 335 to allow the positive/negative duty time interval detecting circuit 335 to determine the difference between the positive duty time interval Dt1 of the positive half-cycle which is defined by the positive control signal Vt1 and the negative duty time interval Dt2 of the negative half-cycle which is defined by the negative control signal Vt2, thereby determining the state of the gas discharge lamp Lp.

Figure 4:
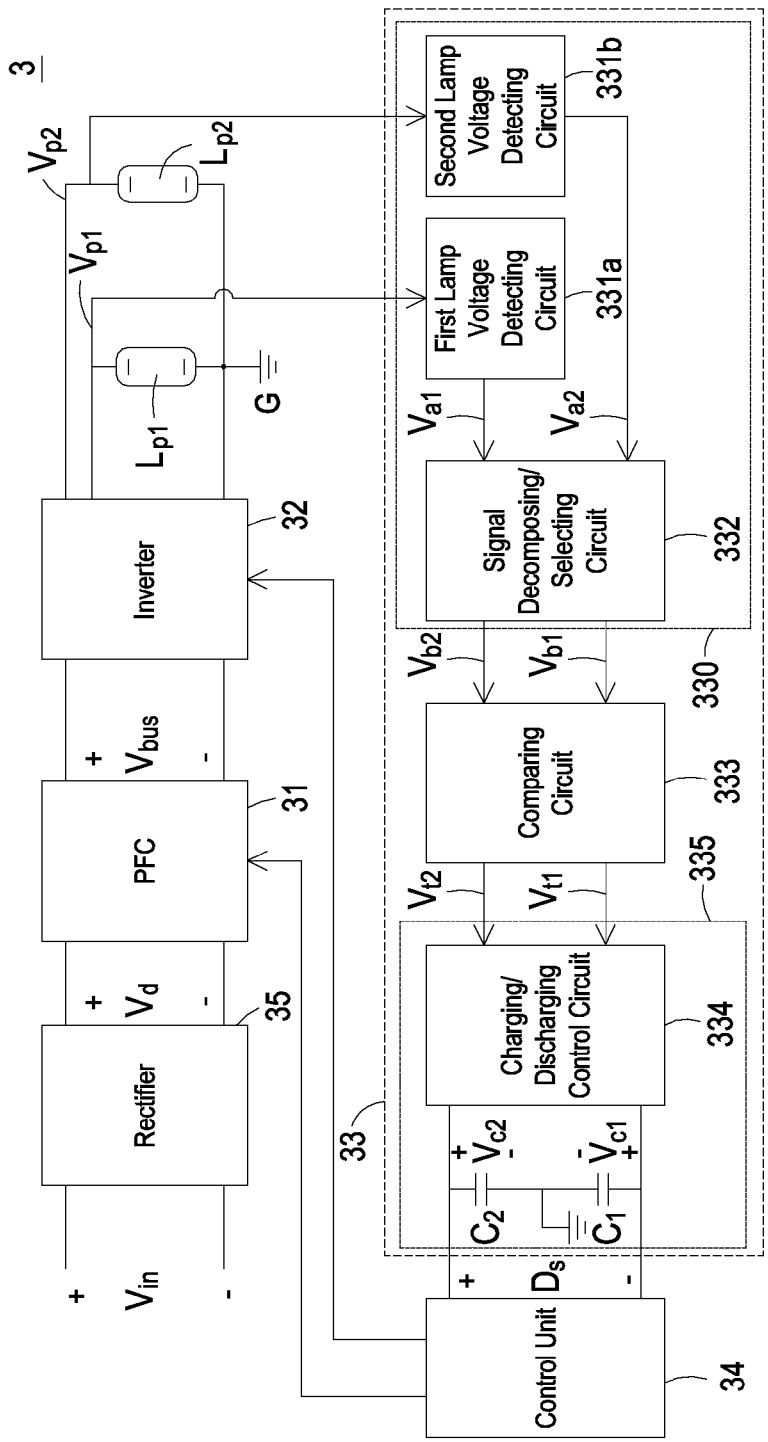
FIG. 4 shows the detailed circuitry of the ballast according to the first embodiment of the invention.

Referring to FIG. 4 and FIG. 3, in which FIG. 4 shows the detailed circuitry of the ballast according to the first embodiment of the invention. As shown in FIG. 4, the ballast 3 includes a power factor correction circuit 31, an inverter 32, an end-of-life detector 33 for gas discharge lamp, a control unit 34, and a rectifier 35. In this embodiment, the inverter 32 is used to convert the bus voltage Vbus into a first lamp voltage Vp1 which is a high-frequency AC voltage and a second lamp voltage Vp2 which is also a high-frequency AC voltage for driving a first gas discharge lamp Lp1 and a second gas discharge lamp Lp2, respectively.

In this embodiment, the end-of-life detector 33 for gas discharge lamp is connected to the first gas discharge lamp Lp1, the second gas discharge lamp Lp2, and the control unit 34 for detecting if the first gas discharge lamp Lp1 and the second gas discharge lamp Lp2 enter the end-of-life state and generating a lamp life state signal Ds accordingly. The lamp life state signal Ds can be varied along with the symmetrical state of the first lamp voltage Vp1 or/and the second lamp voltage Vp2. When the control unit 34 determines that the first gas discharge lamp Lp1 or/and the second gas discharge lamp Lp2 has entered the end-of-life state by the lamp life state signal Ds, the control unit 34 will activate the protection function to stop driving the gas discharge lamp Lp that has entered the end-of-life state.

In this embodiment, the lamp state signal detecting circuit 330 may include a first lamp voltage detecting circuit 331a, a second lamp voltage detecting circuit 331b, and a signal decomposing and selecting circuit 332. The first lamp voltage detecting circuit 331a and the second lamp voltage detecting circuit 331b are connected to the first gas discharge lamp Lp1, the second gas discharge lamp Lp2, and the signal decomposing and selecting circuit 332 for respectively detecting a lamp state signal associated with the first gas discharge lamp Lp1 and detecting a lamp state signal associated with the second gas discharge lamp Lp2. The lamp state signal associated with the first gas discharge lamp Lp1 could be a first lamp voltage Vp1, and the lamp state signal associated with the second gas discharge lamp Lp2 could be a second lamp voltage Vp2. Accordingly, the first lamp voltage detecting circuit 331a and the second lamp voltage detecting circuit 331b can respectively generate a first lamp voltage detecting signal Va1 having the same waveform with the first lamp voltage Vp1 and a second lamp voltage detecting signal Va2 having the same waveform with the second lamp voltage Vp2. The signal decomposing and selecting circuit 332 is connected to the first lamp voltage detecting circuit 331a, the second lamp voltage detecting circuit 331b, and the comparing circuit 333 for selectively decomposing the positive voltage signal Vb1 during the positive half-cycle from the received first lamp voltage detecting signal Va1 or/and the received second lamp voltage detecting signal Va2 and decomposing the negative voltage signal Vb2 during the negative half-cycle from the received first lamp voltage detecting signal Va1 or/and the received second lamp voltage detecting signal Va2.

In this embodiment, during the positive half-cycle, the signal decomposing and selecting circuit 332 holds a selection policy that selects the one from the first lamp voltage detecting signal Va1 and the second lamp voltage detecting signal Va2 that has a higher voltage level. In the negative half-cycle, the signal decomposing and selecting circuit 332 holds a selection policy that selects the one from the first lamp voltage detecting signal Va1 and the second lamp voltage detecting signal Va2 that has a lower voltage level. Therefore, the waveform of the positive voltage signal Vb1 is selected from the waveform of the first lamp voltage detecting signal Va1 and the waveform of the second lamp voltage detecting signal Va2 that has a higher voltage level in the positive half-cycle. Likewise, the negative voltage signal Vb2 will have the waveform that selects from the waveform of the first lamp voltage detecting signal Va1 and the waveform of the second lamp voltage detecting signal Va2 that has a lower voltage level in the negative half-cycle.

In this embodiment, the positive/negative duty time interval detecting circuit 335 includes a charging/discharging control circuit 334, a first capacitor C1, and a second capacitor C2. When the voltage level of the first lamp voltage Vp1 or the voltage level of the second lamp voltage Vp2 is higher than the positive reference voltage Vref1 in the positive half-cycle, the positive voltage signal Vb1 will be higher than the positive selecting voltage Vk1. Under this condition, the positive control signal Vt1 is at an enabling state with a high voltage level, and the charging/discharging control circuit 334 will discharge (or charge) the first capacitor C1. On the contrary, when the voltage level of the first lamp voltage Vp1 or the voltage level of the second lamp voltage Vp2 is lower than the positive reference voltage Vref1 in the positive half-cycle, the positive voltage signal Vb1 will be lower than the positive selecting voltage Vk1. Under this condition, the positive control signal Vt1 is at a disabling state with a low voltage level, and the charging/discharging control circuit 334 will charge (or discharge) the first capacitor C1.

Likewise, when the voltage level of the first lamp voltage Vp1 or the voltage level of the second lamp voltage Vp2 is lower than the negative reference voltage Vref2 in the negative half-cycle, the negative voltage signal Vb2 will be lower than the negative selecting voltage Vk2. Under this condition, the negative control signal Vt2 is at an enabling state with a high voltage level, and the charging/discharging control circuit 334 will discharge (or charge) the second capacitor C2. On the contrary, when the voltage level of the first lamp voltage Vp1 or the voltage level of the second lamp voltage Vp2 is higher than the negative reference voltage Vref2 in the negative half-cycle, the negative voltage signal Vb2 will be higher than the negative selecting voltage Vk2. Under this condition, the negative control signal Vt2 is at a disabling state with a low voltage level, and the charging/discharging control circuit 334 will charge (or discharge) the second capacitor C2.

In this embodiment, the absolute value of the positive reference voltage Vref1 and the absolute value of the negative reference voltage Vref2 are equal and are not zero. Also, the positive selecting voltage Vk1 is proportional to the positive reference voltage Vref1, and the negative selecting voltage Vk2 is proportional to the negative reference voltage Vref2. Hence, the absolute value of the positive selecting voltage Vk1 and the absolute value of the negative selecting voltage Vk2 are equal and are not zero. As the RC time constant of the charging/discharging control circuit 334 for charging or discharging the first capacitor C1 and the second capacitor C2 is larger than the period of the first lamp voltage Vp1 or the period of the second lamp voltage Vp2, both the first capacitor voltage Vc1 and the second capacitor voltage Vc2 have smooth waveform.

In this embodiment, the positive/negative duty time interval detecting circuit 335 may be implemented by alternative circuitry without being limited to be implemented by the circuitry disclosed in FIG. 4 or the circuitry disclosed in FIG. 8, as long as the positive/negative duty time interval detecting circuit 335 is able to use the lamp life state signal Ds which is generated by the difference between the positive duty time interval defined by the positive control signal and the negative duty time interval defined by the negative control signal to determine the state of the gas discharge lamp.

Figure 5:
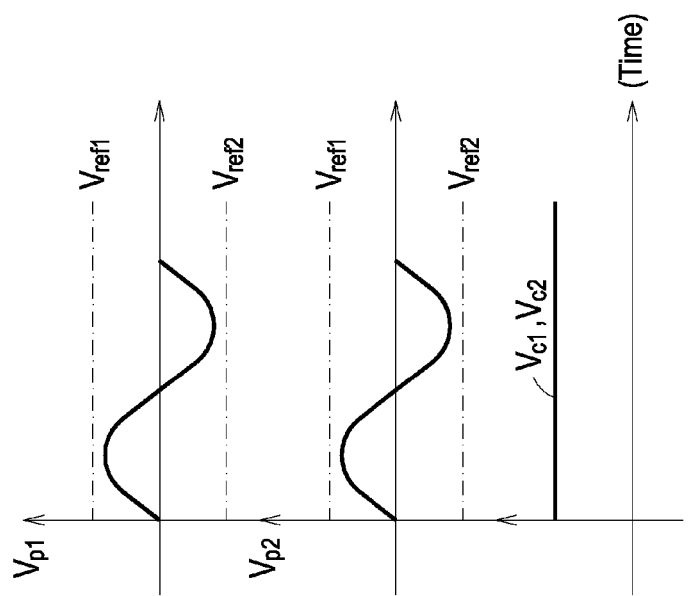
FIGS. 5-7 show the signal waveforms associated with the ballast according to the first embodiment of the invention.
Figure 7:
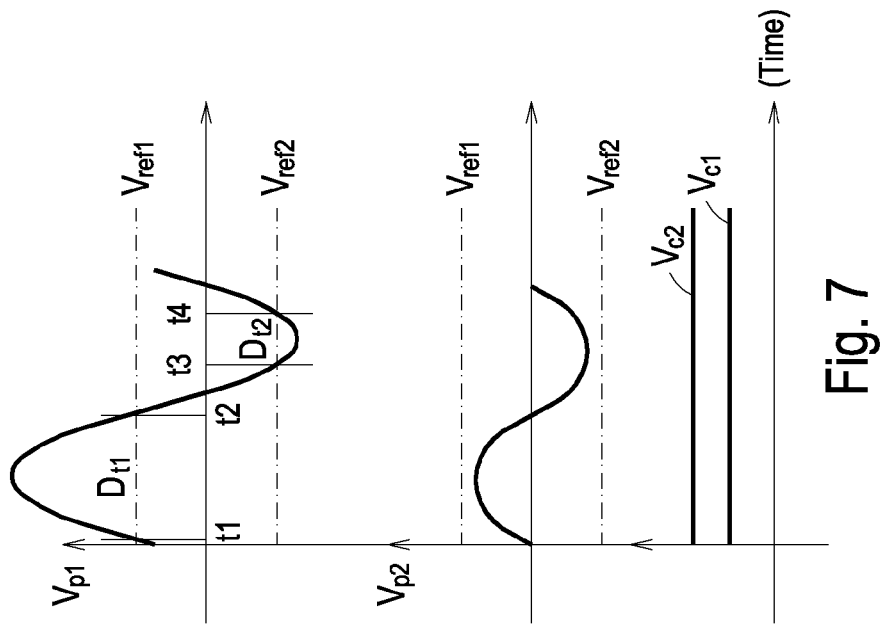
Figure 6:
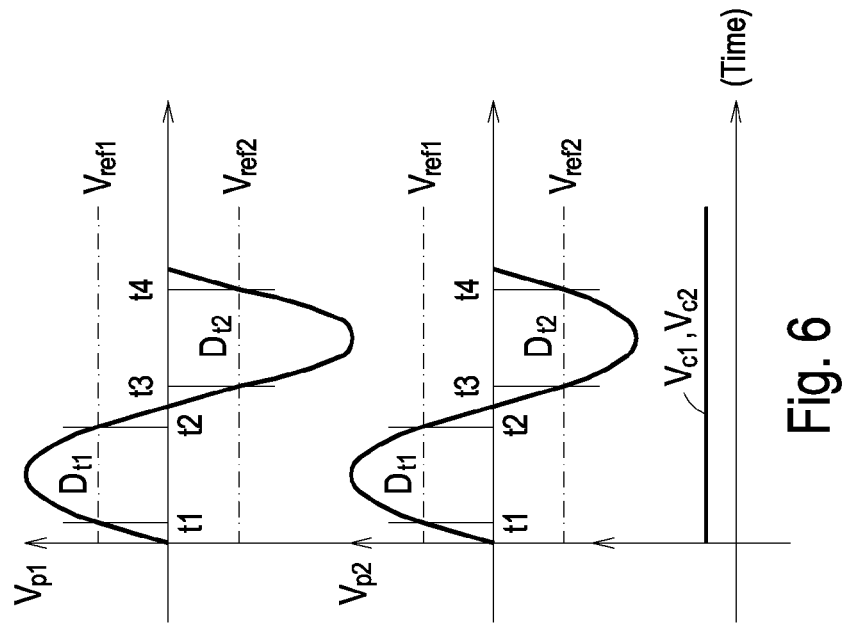

Referring to FIGS. 5-7 and FIGS. 3-4, in which FIGS. 5-7 show the signal waveforms associated with the ballast according to the first embodiment of the invention. As shown in FIG. 5, when the first gas discharge lamp Lp1 and the second gas discharge lamp Lp2 are operating normally, the voltage level of the first lamp voltage Vp1 and the voltage level of the second lamp voltage Vp2 are both low, and the peak values of the first lamp voltage Vp1 and the waveform of the second lamp voltage Vp2 are lower than the positive reference voltage Vref1 in the positive half-cycle and are higher than the negative reference voltage Vref2 in the negative half-cycle. Hence, the charging time or discharging time of the first capacitor C1 and the charging time or discharging time of the second capacitor C2 are equal. Thus, the first capacitor voltage Vc1 and the second capacitor Vc2 are substantially equal. The absolute value of the difference between the first capacitor voltage Vc1 and the second capacitor Vc2 is 0V, or lower than a first predetermined voltage value if error is taken into consideration. That is, the absolute value of the voltage level of the lamp life state signal Ds will be 0V, or lower than the first predetermined voltage value if error is taken into consideration.

Whether the voltage waveform of the lamp voltage Vp1 and the voltage waveform of the lamp voltage Vp2 are substantially symmetrical or not can be determined by the following criteria: (1) the charging time or the discharging time of the first capacitor C1 and the charging time or the discharging time of the second capacitor C2 are equal or smaller than the predetermined time period; (2) the absolute value of the difference between the first capacitor voltage Vc1 and the second capacitor Vc2 is 0V or lower than the first predetermined voltage value; or (3) the absolute value of the voltage level of the lamp life state signal Ds will be 0V or lower than the first predetermined voltage value. As shown in FIG. 6, both of the first gas discharge lamp Lp1 and the second gas discharge lamp Lp2 have not been ignited. Under this condition, the voltage level of the first lamp voltage Vp1 and the voltage level of the second lamp voltage Vp2 are both high and are substantially symmetrical in the positive half-cycle and in the negative half-cycle. During the positive duty time interval Dt1 where the first lamp voltage Vp1 or the second lamp voltage Vp2 is higher than the positive reference voltage Vref1, the positive control signal Vt1 is at an enabling state with a high voltage level. Under this condition, the charging/discharging control circuit 334 will discharge (or charge) the first capacitor C1. On the contrary, during the negative duty time interval Dt2 where the first lamp voltage Vp1 or the second lamp voltage Vp2 is lower than the negative reference voltage Vref2, the negative control signal Vt2 is at an enabling state with a high voltage level. Under this condition, the charging/discharging control circuit 334 will discharge (or charge) the second capacitor C2.

When the gas discharge lamps have not been ignited, the absolute value of the positive reference voltage Vref1 and the absolute value of the negative reference voltage Vref2 are equal, and the voltage waveform of the first lamp voltage Vp1 and the voltage waveform of the second lamp voltage Vp2 are substantially symmetrical. Hence, the positive duty time interval Dt1 and the negative duty time interval Dt2 are substantially equal. That is, the difference Dt1 between the first time point t1 and the second time point t2 is substantially equal to the difference Dt2 between the third time point t3 and the fourth time point t4. Therefore, the charging time or the discharging time of the first capacitor C1 and the charging time or the discharging time of the second capacitor C2 are substantially equal. That is, the voltage level of the first capacitor voltage Vc1 and the voltage level of the second capacitor voltage Vc2 are substantially equal. Hence, the absolute of the voltage level of the lamp life state signal Ds will be 0V or lower than the first predetermined voltage value Referring to FIG. 5 and FIG. 6, whether the first gas discharge lamp Lp1 and the second gas discharge lamp Lp2 have been ignited or not, the first lamp voltage Vp1 and the second lamp voltage Vp2 that have symmetrical voltage waveforms will make the absolute value of the lamp life state signal Ds to be 0V or lower than the first predetermined voltage value as long as the first gas discharge lamp Lp1 and the second gas discharge lamp Lp2 do not enter the end-of-life state.

As shown in FIG. 7, the first gas discharge lamp Lp1 has entered the end-of-life state and the second gas discharge lamp Lp2 is operating normally. Under this condition, the voltage waveform of the first gas discharge lamp Lp1 is asymmetrical and the voltage waveform of the second gas discharge lamp Lp2 is substantially symmetrical. According to the selection policy of the signal decomposing and selecting circuit 332, the waveform of the positive voltage signal Vb1 is selected from the waveform of the first lamp voltage detecting signal Va1 and the second lamp voltage detecting signal Va2 that has a higher voltage level during the positive half-cycle. The waveform of the negative voltage signal Vb2 is selected from the waveform of the first lamp voltage detecting signal Va1 and the second lamp voltage detecting signal Va2 that has a lower voltage level during the negative half-cycle. Also, the absolute value of the positive reference voltage Vref1 and the absolute value of the negative reference voltage Vref2 are equal. Hence, the positive duty time interval Dt1 and the negative duty time interval Dt2 are unequal. In this manner, the charging time or discharging time of the first capacitor C1 and the charging time or discharging time of the second capacitor C2 are unequal, and thus the first capacitor voltage Vc1 and the second capacitor voltage Vc2 are unequal. Therefore, the voltage level of the lamp life state signal Ds which is generated by the difference between the first capacitor voltage Vc1 and the second capacitor voltage Vc2 is not 0V.

In this embodiment, the positive duty time interval Dt1 is larger than the negative duty time interval Dt2. That is, the first lamp voltage Vp1 of the first gas discharge lamp Lp1 that has entered the end-of-life state moves upwards, and thus the first capacitor voltage Vc1 will be unequal to the second capacitor voltage Vc2. Hence, the lamp life state signal Ds between the first capacitor voltage Vc1 and the second capacitor voltage Vc2 is not equal to zero. On the contrary, in other embodiments the positive duty time interval Dt1 is smaller than the negative duty time interval Dt2. That is, the first lamp voltage Vp1 of the first gas discharge lamp Lp1 that has entered the end-of-life state moves downwards (not shown), and thus the first capacitor voltage Vc1 will be also unequal to the second capacitor voltage Vc2. Hence, the lamp life state signal Ds between the first capacitor voltage Vc1 and the second capacitor voltage Vc2 is not equal to zero.

It can be understood from the above statements that the voltage level of the lamp life state signal Ds will be varied along with the voltage symmetrical state of the first lamp voltage Vp1 and the second lamp voltage Vp2. Hence, the control unit 34 can determine if the first gas discharge lamp Lp1 or/and the second gas discharge lamp Lp2 enters the end-of-life state according to the absolute value of the lamp life state signal Ds.

In this embodiment, when the voltage waveform of the first lamp voltage Vp1 and the voltage waveform of the second lamp voltage Vp2 are substantially symmetrical, the absolute value of the lamp life state signal Ds (|Ds|) will be 0 or lower than the first predetermined value. The first predetermined value can be set according to user's demands or the product's requirements. The control unit 34 can determine that the first gas discharge lamp Lp1 or/and the second gas discharge lamp Lp2 does not enter the end-of-life state by detecting that the absolute value of the lamp life state signal Ds (|Ds|) is 0 or lower than the first predetermined value. On the contrary, when the the voltage waveform of the first lamp voltage Vp1 and the voltage waveform of the second lamp voltage Vp2 are asymmetrical, the absolute value of the lamp life state signal Ds (|Ds|) will be higher than the first predetermined value. The control unit 34 can determine if the first gas discharge lamp Lp1 or/and the second gas discharge lamp Lp2 has entered the end-of-life state by detecting if the absolute value of the lamp life state signal Ds (|Ds|) is higher than the first predetermined value. If the control unit 34 determines that the first gas discharge lamp Lp1 or/and the second gas discharge lamp Lp2 has entered the end-of-life state, the power factor correction circuit 31 or/and the inverter 32 is driven to activate the protection function to stop driving the gas discharge lamp that has entered the end-of-life state. As shown in FIG. 7, the ballast 3 will stop driving the gas discharge lamp LP1.

In this embodiment, the control unit 34 can carry out the comparison between the positive duty time interval Dt1 and the negative duty time interval Dt2 by determining whether the lamp life state signal Ds is a positive value or a negative value. That is, the control unit 34 can determine asymmetrical offset direction of the voltage waveform of the first lamp voltage Vp1 or/and the second lamp voltage Vp2.

Referring to FIG. 8 and FIGS. 4-7, in which FIG. 8 shows the partial circuitry of the ballast according to the first embodiment of the invention. As shown in FIG. 8, the first lamp voltage detecting circuit 331a is consisted of a first resistor R1 and a second resistor R2 connected in series with each other. The junction node connecting the first resistor R1 and the second resistor R2 is connected to the first input end of the signal decomposing and selecting circuit 332. The first lamp voltage detecting circuit 331a can divide the first lamp voltage Vp1 by the first resistor R1 and the second resistor R2 to generate a first lamp voltage detecting signal Va1. Likewise, the second lamp voltage detecting circuit 331 is consisted of an eleventh resistor R11 and a twelfth resistor R12 connected in series with each other. The junction node connecting the eleventh resistor R11 and the twelfth resistor R12 is connected to the second input end of the signal decomposing and selecting circuit 332. The second lamp voltage detecting circuit 331b can divide the second lamp voltage Vp2 by the eleventh resistor R11 and the twelfth resistor R12 to generate a second lamp voltage detecting signal Va2.

In this embodiment, the signal decomposing and selecting circuit 332 includes a first diode D1, a second diode D2, a third diode D3, and a fourth diode D4. The first diode D1 is connected between a first input terminal of the signal decomposing and selecting circuit 332 and a positive output terminal of the signal decomposing and selecting circuit 332. The second diode D2 is connected between the first input terminal of the signal decomposing and selecting circuit 332 and a negative output terminal of the signal decomposing and selecting circuit 332. The third diode D3 is connected between a second input terminal of the signal decomposing and selecting circuit 332 and the positive output terminal of the signal decomposing and selecting circuit 332. The fourth diode D4 is connected between the second input terminal of the signal decomposing and selecting circuit 332 and the negative output terminal of the signal decomposing and selecting circuit 332. The cathode of the first diode D1 and the cathode of the third diode D3 are connected to the positive output terminal of the signal decomposing and selecting circuit 332 to form a wired-OR circuit. Thus, the positive voltage signal Vb1 is equal to the one of the first lamp voltage detecting signal Va1 and the second lamp voltage detecting signal Va2 that has a higher voltage level in the positive half-cycle. Likewise, the anode of the second diode D2 and the anode of the fourth diode D4 are connected to the negative output terminal of the signal decomposing and selecting circuit 332 to form a wired-OR circuit. Thus, the negative voltage signal Vb2 is equal to the one of the first lamp voltage detecting signal Va1 and the second lamp voltage detecting signal Va2 that has a lower voltage level in the negative half-cycle.

In this embodiment, the comparing circuit 333 includes a first zener diode Dz1, a second zener diode Dz2, a third switch Q3, and a seventh resistor R7. The first zener diode Dz1 is connected between a positive input terminal of the comparing circuit 333 and a positive control terminal of the comparing circuit 333. When the positive voltage signal Vb1 is higher than a positive selecting voltage which equals to the breakdown voltage of the first zener diode Dz1, i.e. when the first lamp voltage Vp1 or the second lamp voltage Vp2 is higher than the positive reference voltage Vref1 during the positive half-cycle, the first zener diode Dz1 will be broken down and the positive control signal Vt1 will be driven to the enabling state with a high voltage level.

In this embodiment, the second zener diode Dz2 is connected between a control terminal of the third switch Q3 and a negative input terminal of the comparing circuit 333. The first terminal of the third switch Q3, such as the emitter, is used to receive a second auxiliary voltage Vcc2. The second terminal of the third switch Q3, such as the collector, is connected to one end of the seventh resistor R7. The other end of the seventh resistor R7 is connected to the negative control terminal of the comparing circuit 333. When the negative voltage signal Vb2 is lower than a negative selecting voltage Vk2 whose absolute value equals to the positive selecting voltage, i.e. when the first lamp voltage Vp1 or the second lamp voltage Vp2 is lower than the negative reference voltage Vref2 during the negative half-cycle, the negative voltage signal Vb2 will turn on the third switch Q3, and the second switch Q2 will also be turned on to drive the negative control signal Vt2 to the enabling state with a high voltage level.

In this embodiment, the comparing circuit 333 further includes an eighth resistor R8, a ninth resistor R9, and a tenth resistor R10. The eighth resistor R8 is connected between the positive control terminal of the comparing circuit 333 and the ground terminal G. The ninth resistor R9 is connected between the negative control terminal of the comparing circuit 333 and the ground terminal G. The tenth resistor R10 is connected between the control terminal of the third switch Q3 and the ground terminal G.

In this embodiment, the charging/discharging control circuit 334 includes a first switch Q1, a second switch Q2, a third resistor R3, a fourth resistor R4, a fifth resistor R5, and a sixth resistor R6. One end of the first capacitor C1 and one end of the second capacitor C2 are connected to the ground terminal G. The other end of the first capacitor C1 and the other end of the second capacitor C2 are respectively connected to one end of the third resistor R3 and one end of the fourth resistor R4. Therefore, the energy of the first auxiliary voltage Vcc1 is transmitted to the first capacitor C1 and the second capacitor C2 through the other end of the third resistor R3 and the other end of the fourth resistor R4, respectively.

The fifth resistor R5 and the first switch Q1 are connected in parallel across the first capacitor C1. Also, the fifth resistor R5 and the third resistor R3 form a first voltage divider. The control terminal of the first switch Q1 is connected to the positive control terminal of the comparing circuit 333. When the positive control signal Vt1 is at the enabling state with a high voltage level, the charging/discharging control circuit 334 will discharge the first capacitor C1 as the first switch Q1 is turned on. On the other hand, when the positive control signal Vt1 is at the disabling state with a low voltage level, the charging/discharging control circuit 334 will charge the first capacitor C1 through the first voltage divider.

Likewise, the sixth resistor R6 and the second switch Q2 are connected in parallel across the second capacitor C2. Also, the sixth resistor R6 and the fourth resistor R4 form a second voltage divider. The control terminal of the second switch Q2 is connected to the negative control terminal of the comparing circuit 333. When the negative control signal Vt2 is at the enabling state with a high voltage level, the charging/discharging control circuit 334 will discharge the second capacitor C2 as the second switch Q2 is turned on. On the other hand, when the negative control signal Vt2 is at the disabling state with a low voltage level, the charging/discharging control circuit 334 will charge the first capacitor C2 through the second voltage divider.

Overall, the end-of-life detector 33 for gas discharge lamp uses the lamp state signal detecting circuit 330 to detect the first lamp voltage Vp1 and the second lamp voltage Vp2, and generate a positive voltage signal Vb1 in the positive half-cycle and a negative voltage signal Vb2 in the negative half-cycle accordingly. Afterwards, the comparing circuit 333 compares the positive voltage signal Vb1 with the positive selecting voltage Vk1 and compares the negative voltage signal Vb2 with the negative selecting voltage Vk2, and in response thereto generating a positive control signal Vt1 which is used to define the positive duty time interval Dt1 and a negative control signal Vt2 which is used to define the negative duty time interval Dt2. Finally, the charging/discharging control circuit 334 discharges the first capacitor C1 and the second capacitor C2 according to the positive duty time interval Dt1 defined by the positive control signal Vt1 and the negative duty time interval Dt2 defined by the negative control signal Vt2. Thus, the voltage level of the first capacitor voltage Vc1 and the voltage level of the second capacitor voltage Vc2 will be varied along with the positive duty time interval Dt1 and the negative duty time interval Dt2, respectively.

In this embodiment, during the positive duty time interval Dt1 defined by the positive control signal Vt1, the charging/discharging control circuit 334 will discharge the first capacitor C1. In the time period other than the positive duty time interval Dt1 during the positive half-cycle, the charging/discharging control circuit 334 will charge the first capacitor C1. On the contrary, during the negative duty time interval Dt2 defined by the negative control signal Vt2, the charging/discharging control circuit 334 will discharge the second capacitor C2. In the time period other than the negative duty time interval Dt2 during the negative half-cycle, the charging/discharging control circuit 334 will charge the second capacitor C2.

In alternative embodiments, the charging/discharging control circuit 334 may discharge and charge the first capacitor C1 and the second capacitor C2 in the positive duty time interval Dt1 and in the negative duty time interval Dt2 with an adverse operating mode. Also, the voltage level of the first capacitor voltage Vc1 and the voltage level of the second capacitor Vc2 may be varied along with the positive duty time interval Dt1 and the negative duty time interval Dt2, respectively. In other words, when the positive control signal Vt1 is at an enabling state with a high voltage level, i.e. in the positive duty time interval Dt1, the charging/discharging control circuit 334 will charge the first capacitor C1. On the contrary, when the positive control signal Vt1 is at a disabling state with a low voltage level, i.e. in the time period other than the positive duty time interval Dt1 during the positive half-cycle, the charging/discharging control circuit 334 will discharge the first capacitor C1. Likewise, when the negative control signal Vt2 is at an enabling state with a high voltage level, i.e. in the negative duty time interval Dt2, the charging/discharging control circuit 334 will charge the second capacitor C2. On the contrary, when the negative control signal Vt2 is at a disabling state with a low voltage level, i.e. in the time period other than the negative duty time interval Dt2 during the negative half-cycle, the charging/discharging control circuit 334 will discharge the second capacitor C2.

In this embodiment, the first capacitor voltage Vc1 and the second capacitor voltage Vc2 of the end-of-life detector 33 for gas discharge lamp is established by charging the first capacitor C1 and the second capacitor C2 by the first auxiliary voltage Vcc1 whose voltage level does not vary along with the first lamp voltage Vp1 and the second lamp voltage Vp2. Also, the timing for charging and discharging is set in the positive duty time interval Dt1 and the negative duty time interval Dt2 where the symmetrical characteristics are apparent. Hence, the lamp life state signal Ds which is based on the difference between the first capacitor voltage Vc1 and the second capacitor voltage Vc2 is more accurate and fast.

In this embodiment, the inverter 32 may be implemented by a half-bridge self-oscillating parallel resonant circuit, which includes a first voltage-dividing capacitor Cp1, a second voltage-dividing capacitor Cp2, a DC choke Lt, a filtering capacitor Ct, a fourth switch Q4, a fifth switch Q5, a resonant capacitor Cr, a transformer Tr, a first output capacitor Co1, and a second output capacitor Co2. The first voltage-dividing capacitor Cp1 and the second voltage-dividing capacitor Cp2 are connected in series with each other and form a bus voltage divider. The junction node between the first voltage-dividing capacitor Cp1 and the second voltage-dividing capacitor Cp2 is connected to one end of the primary winding N1 of the transformer Tr for generating one-half of the bus voltage (Vbus/2) thereon.

In this embodiment, the fourth switch Q4 and the fifth switch Q5 are connected in series with each other to form a half-bridge switch circuit. The junction node between the fourth switch Q4 and the fifth switch Q5 is connected to the other end of the primary winding N1 of the transformer Tr. The control terminal of the fourth switch Q4 is connected to the first control winding N3 of the transformer Tr and the control terminal of the fifth switch Q5 is connected to the second control winding N4 of the transformer Tr. In operation, the control signal generated by the first control winding N3 and the second control winding N4 are used to drive the the fourth switch Q4 and the fifth switch Q5 to turn on and off alternately. Thus, the energy of the bus voltage Vbus can be transmitted to the primary winding through the fourth switch Q4 and the fifth switch Q5.

In this embodiment, the resonant capacitor Cr and primary winding N1 are connected in parallel with each other. Thus, the resonant capacitor Cr and the equivalent primary inductance of the primary winding N1 form a resonant tank. By the resonant characteristics of the resonant tank, the output voltage of the inverter 32 (i.e. the voltage value of the first lamp voltage Vp1 and the voltage value of the second lamp voltage Vp2) is regulated. The DC choke Lt is connected between the bus voltage divider and the half-bridge switch circuit. The filtering capacitor Ct is connected to the half-bridge switch circuit. The first output capacitor Co1 and the second output capacitor Co2 are connected to the secondary winding N2, the first gas discharge lamp Lp1, and the second gas discharge lamp Lp2. Also, the first output capacitor Co1 and the second output capacitor Co2 are connected in series with the first gas discharge lamp Lp1 and the second gas discharge lamp Lp2, respectively.

Figure 9:
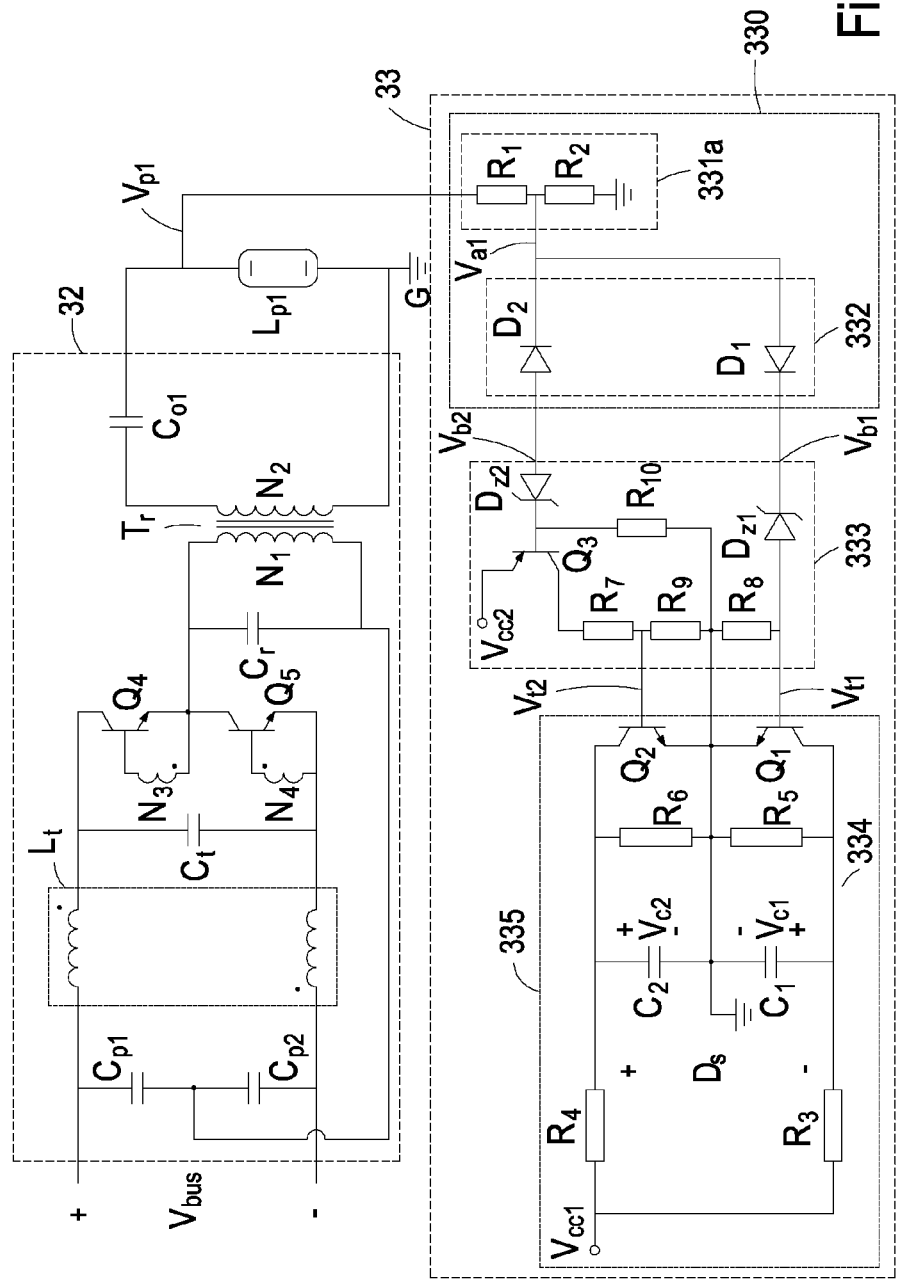
FIG. 9 shows the partial circuitry of the ballast according to a second embodiment of the invention.

Referring to FIG. 8 and FIG. 9, in which FIG. 9 shows the partial circuitry of the ballast according to a second embodiment of the invention. In this embodiment, the end-of-life detector 33 for gas discharge lamp can be used to drive the ballast for a single gas discharge lamp Lp1. In this embodiment, the lamp state signal detecting circuit 330 only includes a first lamp voltage detecting circuit 331a and a signal decomposing and selecting circuit 332. In this embodiment, the first lamp voltage detecting signal Va1 whose waveform is the same as the first lamp voltage Vp1 is generated by the first lamp voltage detecting circuit 331a. Next, the first lamp voltage detecting signal Va1 is rectified into the positive voltage signal Vb1 and the negative voltage signal Vb2 by the signal decomposing and selecting circuit 332. The following operations are similar to the operations of the end-of-life detector 33 for gas discharge lamp of FIG. 8, and it is not intended to give details about the end-of-life detector 33 for gas discharge lamp of FIG. 9 herein.

Figure 10:
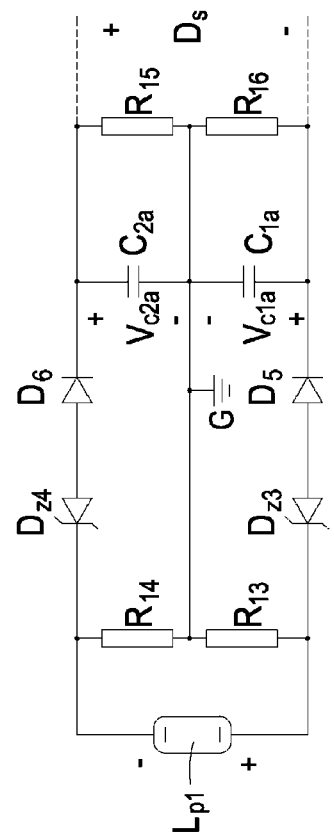
FIG. 10 shows the circuitry of the end-of-life detector for gas discharge lamp according to a third embodiment of the invention.

Referring to FIG. 9, FIG. 10, and FIG. 4, in which FIG. 10 shows the circuitry of the end-of-life detector for gas discharge lamp according to a third embodiment of the invention. Compared with FIG. 9, the circuitry of the end-of-life detector 33 for gas discharge lamp of FIG. 10 is a modified version of the FIG. 9 which is made by simplifying the circuitry of the first lamp voltage detecting circuit 331a, the signal decomposing and selecting circuit 332, the comparing circuit 333, and the positive/negative duty time interval detecting circuit 335. However, the operations of the end-of-life detector 33 for gas discharge lamp of FIG. 10 are the same with the end-of-life detector 33 for gas discharge lamp of FIG. 9. The end-of-life detector 33 for gas discharge lamp of FIG. 10 includes a thirteenth resistor R13, a fourteenth resistor R14, a fifteenth resistor R15, a sixteenth resistor R16, a fifth diode D5, a sixth diode D6, a third zener diode Dz3, a fourth zener diode Dz4, a first capacitor C1a, and a second capacitor C2a. One end of the second capacitor C2a and one end of the first capacitor C1a are connected to the ground terminal G. The other end of the second capacitor C2a and the other end of the first capacitor C1a are respectively connected to the one end of the fifteenth resistor R15 and one end of the sixteenth resistor R16, and are respectively connected in parallel with the fifteenth resistor R15 and the sixteenth resistor R16. One end of the thirteenth resistor R13 and one end of the fourteenth resistor R14 are connected to the ground terminal G. The other end of the thirteenth resistor R13 and the other end of the fourteenth resistor R14 are respectively connected one end of the first gas discharge lamp Lp1. The third zener diode Dz3 and the fifth diode D5 are connected in series with each other and form a first circuit loop. The first circuit loop is connected between one end of the first capacitor C1a and one end of the first gas discharge lamp Lp1. The fourth zener diode Dz4 and the sixth diode D6 are connected in series with each other and form a second circuit loop. The second circuit loop is connected between one end of the second capacitor C2a and the other end of the first gas discharge lamp Lp1.

In this embodiment, during the positive duty time interval Dt1 where the first lamp voltage Vp1 is higher than the positive reference voltage Vref1, the energy of the first lamp voltage Vp1 divided by the resistors R14 and R16 is transmitted to the first capacitor C1a through the first circuit loop consisted of the third zener diode Dz3 and the fifth diode D5, thereby charging the first capacitor C1a. The energy of the first lamp voltage Vp1 is transmitted through the first circuit loop, the first capacitor C1a, and the fourteenth resistor R14. On the contrary, during the negative duty time interval Dt2 where the first lamp voltage Vp1 is lower than the negative reference voltage Vref2, the energy of the first lamp voltage Vp1 divided by the resistors R13 and R15 is transmitted to the second capacitor C2a through the second circuit loop consisted of the fourth zener diode Dz4 and the sixth diode D6, thereby charging the second capacitor C2a. The energy of the first lamp voltage Vp1 is transmitted through the second circuit loop, the second capacitor C2a, and the thirteenth resistor R13.

In alternative embodiments, the end-of-life detector 33 for gas discharge lamp may be set to allow the first capacitor C1a and the second capacitor C2a to operate under the discharge mode in the positive duty time interval Dt1 and in the negative duty time interval Dt2.

In this embodiment, when the first capacitor C1a and the second capacitor C2a are being charged or discharged, the energy of the first lamp voltage Vp1 will be used to charge or discharge the first capacitor C1a and the second capacitor C2a through the third zener diode Dz3 and the fourth zener diode Dz4, respectively. Also, the timing for the first lamp voltage Vp1 to charge or discharge the first capacitor C1a and the second capacitor C2a is set in the positive duty time interval Dt1 and the negative duty time interval Dt2 where the lamp voltages show apparent symmetrical characteristics. Hence, the lamp life state signal Ds which is the difference between the first capacitor voltage Vc1a and the second capacitor voltage Vc2a will be accurate and fast. When the first gas discharge lamp Lp1 has entered the end-of-life state, the first capacitor voltage Vc1a and the second capacitor voltage Vc2a will be unequal. Under this condition, the absolute value of the lamp life state signal Ds will not be zero. Nonetheless, the control unit 34 will activate the protection functions.

In conclusion, the inventive end-of-life detector for gas discharge lamp is set to determine the timing for charging or discharging the first capacitor and the second capacitor in the positive duty time interval and in the negative duty time interval where the symmetrical characteristics of the lamp voltage are apparent. Also, the lamp life state signal which is the difference between the first capacitor voltage and the second capacitor voltage can represent symmetry of the lamp voltage. Hence, the lamp life state signal is more accurate.

Furthermore, as the inventive end-of-life detector for gas discharge lamp is applied to the ballast, the end-of-life detector for gas discharge lamp can detect if the gas discharge lamp has entered the end-of-life state. When the gas discharge lamp has entered the end-of-life state, the control unit of the ballast will activate the protection function to stop driving the gas discharge lamp which has entered the end-of-life state. Thus, the electrodes of the gas discharge lamp can be prevented from overheating, and the fixture socket securing the gas discharge lamp can be protected from damage.

While the invention has been described in terms of what are presently considered to be the most practical and preferred embodiments, it is to be understood that the invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the invention which is defined by the appended claims.

What is claimed is:

1. An end-of-life detector for gas discharge lamp for detecting a lamp state of at least one first gas discharge lamp, comprising:
   a lamp state signal detecting circuit connected to the at least one first gas discharge lamp for detecting a lamp state signal of the at least one first gas discharge lamp and in response thereto generating a positive voltage signal during a positive half-cycle of the lamp state signal and a negative voltage signal during a negative half-cycle of the lamp state signal;
   a comparing circuit connected to the lamp state signal detecting circuit for comparing the positive voltage signal with a positive selecting voltage and comparing the negative voltage signal with a negative selecting voltage, and in response thereto generating a positive control signal and a negative control signal; and a positive/negative duty time interval detecting circuit connected to the comparing circuit for generating a lamp life state signal which is generated by a difference between a positive duty time interval defined by the positive control signal and a negative duty time interval defined by the negative control signal;

wherein the lamp life state signal is varied along with the difference between the positive duty time interval and the negative duty time interval.

2. The end-of-life detector according to claim 1, wherein the lamp state signal detecting circuit includes:

a first lamp voltage detecting circuit connected to a first gas discharge lamp for reducing a first lamp voltage a first lamp voltage detecting signal, wherein the first lamp voltage detecting signal has the same waveform with the first lamp voltage;

a signal decomposing and selecting circuit connected to the first lamp voltage detecting circuit for decomposing the first lamp voltage detecting signal into a positive voltage signal during the positive half-cycle and a negative voltage signal during the negative half-cycle.

3. The end-of-life detector according to claim 2, wherein the first lamp voltage detecting circuit includes:

a first resistor; and a second resistor connected in series with the first resistor to form a voltage divider with the first resistor for dividing the first lamp voltage to generate the first lamp voltage detecting signal.

4. The end-of-life detector according to claim 2, further comprising:

a second lamp voltage detecting circuit connected to a second gas discharge lamp and the signal decomposing and selecting circuit for reducing a second lamp voltage of the second gas discharge lamp a second lamp voltage detecting signal, and the second lamp voltage detecting signal has the same waveform with the second lamp voltage;

wherein the signal decomposing and selecting circuit is configured to selectively decompose the first lamp voltage detecting signal or/and the second lamp voltage detecting signal into a positive voltage signal during the positive half-cycle and a negative voltage signal during the negative half-cycle.

5. The end-of-life detector according to claim 1, wherein the positive/negative duty time interval detecting circuit includes:

a first capacitor;

a second capacitor connected to the first capacitor; and a charging/discharging control circuit connected to the first capacitor, the second capacitor, and the comparing circuit for selectively charging or discharging the first capacitor and the second capacitor according to a state of the positive control signal and a state of the negative control signal, thereby allowing a first capacitor voltage of the first capacitor and a second capacitor voltage of the second capacitor to vary along with the positive duty time interval and the negative duty time interval, respectively;

wherein the lamp life state signal is the difference between the first capacitor voltage and the second capacitor voltage.

6. The end-of-life detector according to claim 5, wherein:

when a waveform of the first lamp voltage or a waveform of the second lamp voltage during the positive half-cycle is higher than a positive reference voltage in the positive duty time interval, the positive control signal is set to an enabling state, and when a waveform of the first lamp voltage or a waveform of the second lamp voltage during the positive half-cycle is lower than the positive reference voltage, the positive control signal is set to a disabling state, and when a waveform of the first lamp voltage or a waveform of the second lamp voltage during the negative half-cycle is lower than a negative reference voltage in the negative duty time interval, the negative control signal is set to an enabling state, and when a waveform of the first lamp voltage or a waveform of the second lamp voltage during the negative half-cycle is higher than the negative reference voltage, the negative control signal is set to a disabling state.

7. The end-of-life detector according to claim 6, wherein when the positive control signal and the negative control signal are at an enabling state, respectively, the charging/discharging control circuit respectively discharges the first capacitor and the second capacitor, and when the positive control signal and the negative control signal are at a disabling state, respectively, the charging/discharging control circuit respectively charges the first capacitor and the second capacitor.

8. The end-of-life detector according to claim 6, wherein when the positive control signal and the negative control signal are at an enabling state, respectively, the charging/discharging control circuit respectively charges the first capacitor and the second capacitor, and when the positive control signal and the negative control signal are at a disabling state, respectively, the charging/discharging control circuit respectively discharges the first capacitor and the second capacitor.

9. The end-of-life detector according to claim 5, wherein one end of the second capacitor and one end of the first capacitor are connected to a ground terminal, and the charging/discharging control circuit includes:

a first switch having a control terminal connected to a positive control terminal of the comparing circuit;

a second switch having a control terminal connected to a negative control terminal of the comparing circuit;

a third resistor having one end connected to the other end of the first capacitor and the other end connected to a first auxiliary voltage for transmitting energy of the first auxiliary voltage to the first capacitor;

a fourth resistor having one end connected to the other end of the second capacitor and the other end connected to the first auxiliary voltage for transmitting energy of the first auxiliary voltage to the second capacitor;

a fifth resistor connected in parallel with the first switch across the first capacitor; and a sixth resistor connected in parallel with the second switch across the second capacitor.

10. The end-of-life detector according to claim 4, wherein the comparing circuit includes:

a first zener diode connected between a positive input terminal of the comparing circuit and a positive control terminal of the comparing circuit;

a seventh resistor having one end connected to a negative control terminal of the comparing circuit;

an eighth resistor connected between a positive control terminal of said comparing circuit and a ground terminal;

a ninth resistor connected between a negative control terminal of said comparing circuit and the ground terminal;

a third switch having a first terminal for receiving a second auxiliary voltage and a second terminal connected to the other end of the seventh resistor;

a tenth resistor connected between a control terminal of said third switch and said ground terminal; and a second zener diode connected between a control terminal of the third switch and a negative input terminal of the comparing circuit;

wherein the first zener diode is broken down in the positive duty time interval to switch the positive control signal to an enabling state, and the third switch is turned on by the negative voltage signal in the negative duty time interval to switch the negative control signal to an enabling state.

11. The end-of-life detector according to claim 4, wherein the signal decomposing and selecting circuit holds a selection policy that selects the one from the first lamp voltage detecting signal and the second lamp voltage detecting signal that has a higher voltage level in the positive half-cycle and selects the one from the first lamp voltage detecting signal and the second lamp voltage detecting signal that has a lower voltage level in the negative half-cycle.

12. The end-of-life detector according to claim 4, wherein the signal decomposing and selecting circuit includes:
 a first diode connected between the first input end of the signal decomposing and selecting circuit and a positive output end of the signal decomposing and selecting circuit;
 a second diode connected between the first input end of the signal decomposing and selecting circuit and a negative output end of the signal decomposing and selecting circuit;
 a third diode connected between a second input end of the signal decomposing and selecting circuit and the positive output end of the signal decomposing and selecting circuit; and
 a fourth diode connected between the second input end of the signal decomposing and selecting circuit and the negative output end of the signal decomposing and selecting circuit;
 wherein said second lamp voltage detecting circuit is consisted of an eleventh resistor and a twelfth resistor connected in series with each other.

13. The end-of-life detector according to claim 5, wherein one end of the second capacitor and one end of the first capacitor are connected to a ground terminal, and the lamp state signal detecting circuit, the comparing circuit, and the charging/discharging control circuit are integrated into an integrated circuit, comprising:
 a thirteenth resistor having one end connected to a ground terminal and the other end connected to one end of the first gas discharge lamp;
 a fourteenth resistor having one end connected to a ground terminal and the other end connected to the other end of the first gas discharge lamp;
 a fifteenth resistor having one end connected to the other end of the second capacitor;
 a sixteenth resistor having one end connected to the other end of the first capacitor;
 a fifth diode;
 a sixth diode;
 a third zener diode connected in series with the fifth diode to form a first circuit loop, wherein the first circuit loop is connected between the first capacitor and one end of the first gas discharge lamp; and
 a fourth zener diode connected in series with the sixth diode to form a second circuit loop, wherein the second circuit loop is connected between the second capacitor and the other end of the first gas discharge lamp.

14. A ballast for driving at least one first gas discharge lamp, comprising:
 a power circuit for converting an input voltage into at least one first lamp voltage to drive the at least one first gas discharge lamp;
 a control unit for controlling operations of the ballast; and
 an end-of-life detector for gas discharge lamp connected to the at least one first gas discharge lamp and the control unit, comprising:
 a lamp state signal detecting circuit connected to the at least one first gas discharge lamp for detecting a lamp state signal of the at least one first gas discharge lamp and in response thereto generating a positive voltage signal during a positive half-cycle of the lamp state signal and a negative voltage signal during a negative half-cycle of the lamp state signal;
 a comparing circuit connected to the lamp state signal detecting circuit for comparing the positive voltage signal with a positive selecting voltage and comparing the negative voltage signal with a negative selecting voltage, and in response thereto generating a positive control signal and a negative control signal; and
 a positive/negative duty time interval detecting circuit connected to the comparing circuit for generating a lamp life state signal which is generated by a difference between a positive duty time interval defined by the positive control signal and a negative duty time interval defined by the negative control signal;
 wherein the lamp life state signal is varied along with the difference between the positive duty time interval and the negative duty time interval, the control unit is configured to control operations of the power circuit according to the lamp life state signal, and when the control unit determines that the first gas discharge lamp has entered an end-of-life state by the lamp life state signal, the control unit activates protection functions of the power circuit.

15. The ballast according to claim 14, wherein the power circuit includes:
 a rectifier for converting an input voltage into a DC voltage;
 a power factor correction circuit connected to the rectifier for converting the DC voltage into a bus voltage and correcting a power factor; and
 an inverter connected to the power factor correction circuit and the at least one first gas discharge lamp for converting the bus voltage into at least one first lamp voltage for driving the at least one first gas discharge lamp.

16. The ballast according to claim 14, wherein the lamp state signal detecting circuit includes:
 a first lamp voltage detecting circuit connected to the first gas discharge lamp for reducing the first lamp voltage into a first lamp voltage detecting signal; and
 a signal decomposing and selecting circuit connected to the first lamp voltage detecting circuit for decomposing the first lamp voltage detecting signal into a positive voltage signal during the positive half-cycle and a negative voltage signal during the negative half-cycle;
 wherein the first lamp voltage detecting circuit includes a first resistor and a second resistor, the second resistor is connected in series with the first resistor to form a voltage divider with the first resistor for dividing the first lamp voltage to generate the first lamp voltage detecting signal, and the first lamp voltage detecting signal has the same waveform with the first lamp voltage.

17. The ballast according to claim 16, wherein the power circuit is configured to drive a second gas discharge lamp, and the lamp state signal detecting circuit further includes:
 a second lamp voltage detecting circuit connected to the second gas discharge lamp and the signal decomposing and selecting circuit for reducing a second lamp voltage of the second gas discharge lamp into a second lamp voltage detecting signal;

wherein the signal decomposing and selecting circuit is configured to selectively decompose the first lamp voltage detecting signal or/and the second lamp voltage detecting signal into a positive voltage signal during the positive half-cycle and a negative voltage signal during the negative half-cycle, and the second lamp voltage detecting signal having the same waveform with the second lamp voltage.

18. The ballast according to claim 17, wherein the signal decomposing and selecting circuit holds a selection policy that selects the one from the first lamp voltage detecting signal and the second lamp voltage detecting signal that has a higher voltage level during the positive half-cycle and selects the one from the first lamp voltage detecting signal and the second lamp voltage detecting signal that has a lower voltage level during the negative half-cycle.

19. The ballast according to claim 17, wherein:

when a waveform of the first lamp voltage or a waveform of the second lamp voltage during the positive half-cycle is higher than a positive reference voltage in the positive duty time interval, the positive control signal is set to an enabling state, and when a waveform of the first lamp voltage or a waveform of the second lamp voltage during the positive half-cycle is lower than the positive reference voltage, the positive control signal is set to a disabling state, and when a waveform of the first lamp voltage or a waveform of the second lamp voltage during the negative half-cycle is lower than a negative reference voltage in the negative duty time interval, the negative control signal is set to an enabling state, and when a waveform of the first lamp voltage or a waveform of the second lamp voltage during the negative half-cycle is higher than the negative reference voltage, the negative control signal is set to a disabling state.

20. The ballast according to claim 14, wherein the positive/negative duty time interval detecting circuit includes:

a first capacitor;

a second capacitor connected to the first capacitor; and a charging/discharging control circuit connected to the first capacitor, the second capacitor, and the comparing circuit for selectively charging or discharging the first capacitor and the second capacitor according to a state of the positive control signal and a state of the negative control signal, thereby allowing a first capacitor voltage of the first capacitor and a second capacitor voltage of the second capacitor to vary along with the positive duty time interval and the negative duty time interval, respectively;

wherein the lamp life state signal is the difference between the first capacitor voltage and the second capacitor voltage.

21. The ballast according to claim 20, wherein when the positive control signal and the negative control signal are at an enabling state, respectively, the charging/discharging control circuit respectively discharges the first capacitor and the second capacitor, and when the positive control signal and the negative control signal are at a disabling state, respectively, the charging/discharging control circuit respectively charges the first capacitor and the second capacitor.

22. The ballast according to claim 20, wherein when the positive control signal and the negative control signal are at an enabling state, respectively, the charging/discharging control circuit respectively charges the first capacitor and the second capacitor, and when the positive control signal and the negative control signal are at a disabling state, respectively, the charging/discharging control circuit respectively discharges the first capacitor and the second capacitor.

23. The ballast according to claim 20, wherein one end of the second capacitor and one end of the first capacitor are connected to a ground terminal, and the charging/discharging control circuit includes:

a first switch having a control terminal connected to a positive control terminal of the comparing circuit;

a second switch having a control terminal connected to a negative control terminal of the comparing circuit;

a third resistor having one end connected to the other end of the first capacitor and the other end connected to a first auxiliary voltage for transmitting energy of the first auxiliary voltage to the first capacitor;

a fourth resistor having one end connected to the other end of the second capacitor and the other end connected to the first auxiliary voltage for transmitting energy of the first auxiliary voltage to the second capacitor;

a fifth resistor connected in parallel with the first switch across the first capacitor; and a sixth resistor connected in parallel with the second switch across the second capacitor.

24. The ballast according to claim 14, wherein the comparing circuit includes:

a first zener diode connected between a positive input terminal of the comparing circuit and a positive control terminal of the comparing circuit;

a seventh resistor having one end connected to a negative control terminal of the comparing circuit;

an eighth resistor connected between a positive control terminal of said comparing circuit and a ground terminal;

a ninth resistor connected between a negative control terminal of said comparing circuit and said ground terminal;

a third switch having a first terminal for receiving a second auxiliary voltage and a second terminal connected to the other end of the seventh resistor;

a tenth resistor connected between a control terminal of said third switch and said ground terminal;

a third switch having a first terminal for receiving a second auxiliary voltage and a second terminal connected to the other end of the seventh resistor; and a second zener diode connected between a control terminal of the third switch and a negative input terminal of the comparing circuit;

wherein the first zener diode is broken down in the positive duty time interval to switch the positive control signal to an enabling state, and the third switch is turned on by the negative voltage signal in the negative duty time interval to switch the negative control signal to an enabling state.

25. The ballast according to claim 16, wherein the signal decomposing and selecting circuit includes:

a first diode connected between a first input end of the signal decomposing and selecting circuit and a positive output end of the signal decomposing and selecting circuit;

a second diode connected between the first input end of the signal decomposing and selecting circuit and a negative output end of the signal decomposing and selecting circuit;

a third diode connected between a second input end of the signal decomposing and selecting circuit and the positive output end of the signal decomposing and selecting circuit; and a fourth diode connected between the second input end of the signal decomposing and selecting circuit and the negative output end of the signal decomposing and selecting circuit;

wherein said second lamp voltage detecting circuit is consisted of an eleventh resistor and a twelfth resistor connected in series with each other.

26. The ballast according to claim 20, wherein one end of the second capacitor and one end of the first capacitor are connected to a ground terminal, and the lamp state signal detecting circuit, the comparing circuit, and the charging/discharging control circuit are integrated into an integrated circuit, comprising:

a thirteenth resistor having one end connected to a ground terminal and the other end connected to one end of the first gas discharge lamp;

a fourteenth resistor having one end connected to a ground terminal and the other end connected to the other end of the first gas discharge lamp;

a fifteenth resistor having one end connected to the other end of the second capacitor;

a sixteenth resistor having one end connected to the other end of the first capacitor;

a fifth diode;

a sixth diode;

a third zener diode connected in series with the fifth diode to form a first circuit loop, wherein the first circuit loop is connected between the first capacitor and one end of the first gas discharge lamp; and a fourth zener diode connected in series with the sixth diode to form a second circuit loop, wherein the second circuit loop is connected between the second capacitor and the other end of the first gas discharge lamp.

* * * * *